United States Patent
Machuca et al.

(10) Patent No.: US 9,487,885 B2
(45) Date of Patent: *Nov. 8, 2016

(54) SUBSTRATE STRUCTURES AND METHODS

(71) Applicant: TIVRA CORPORATION, Pleasant Hill, CA (US)

(72) Inventors: Francisco Machuca, Oakland, CA (US); Indranil De, Mountain View, CA (US)

(73) Assignee: Tivra Corporation, Pleasant Hill, CA (US)

( * ) Notice: Subject to any disclaimer, the term of this patent is extended or adjusted under 35 U.S.C. 154(b) by 4 days.

This patent is subject to a terminal disclaimer.

(21) Appl. No.: 14/106,657

(22) Filed: Dec. 13, 2013

(65) Prior Publication Data

US 2015/0167198 A1   Jun. 18, 2015

(51) Int. Cl.
| | |
|---|---|
| *C30B 25/18* | (2006.01) |
| *C30B 29/42* | (2006.01) |
| *C30B 23/02* | (2006.01) |
| *C30B 29/40* | (2006.01) |
| *H01L 33/00* | (2010.01) |

(52) U.S. Cl.
CPC ........... *C30B 25/183* (2013.01); *C30B 23/025* (2013.01); *C30B 25/186* (2013.01); *C30B 29/406* (2013.01); *H01L 33/0079* (2013.01)

(58) Field of Classification Search
None
See application file for complete search history.

(56) References Cited

U.S. PATENT DOCUMENTS

| | | |
|---|---|---|
| 4,222,345 A | 9/1980 | Bergfelt et al. |
| 4,999,314 A | 3/1991 | Pribat et al. |
| 5,372,089 A | 12/1994 | Yoshida et al. |
| 5,821,562 A | 10/1998 | Makita et al. |
| 5,906,857 A | 5/1999 | McKee et al. |
| 6,645,833 B2 | 11/2003 | Brendel et al. |
| 7,229,500 B2 | 6/2007 | Haushalter et al. |
| 7,435,300 B2 | 10/2008 | Ling et al. |

(Continued)

FOREIGN PATENT DOCUMENTS

| | | |
|---|---|---|
| EP | 0 499 982 A1 | 8/1992 |
| EP | 0544399 A2 | 6/1993 |

(Continued)

OTHER PUBLICATIONS

Phase Diagram Images and Software from the National Physical Laboratory (NPL) for the Zr—Ti System, May 4, 2000 [online], [retrieved on Nov. 12, 2013], Retrieved from the Internet: <URL: http://resource.npl.co.uk/mtdata/phdiagrams/png/hfzr.png>; p. 1.

(Continued)

*Primary Examiner* — Asok K Sarkar
(74) *Attorney, Agent, or Firm* — Alston & Bird LLP

(57) ABSTRACT

A process for separating a substrate from an epitaxial layer comprises forming a multilayer substrate comprising a substrate, a lattice matching layer and an epitaxial layer. The method further comprises etching the lattice matching layer by one of a liquid or a vapor phase acid. The lattice matching layer is a metal alloy between the substrate and the epitaxial layer and serves as an etching release layer. The substrate can also be separated from an epitaxial layer by laser lift off process. The process comprises forming a multilayer substrate comprising a substrate, a lattice matching layer and an epitaxial layer, directing laser light at the lattice matching layer, maintaining the laser light on the lattice matching layer for a sufficient period of time so that it is absorbed by free electrons in the lattice matching layer to allow decomposition of the lattice matching layer.

7 Claims, 6 Drawing Sheets

(56) References Cited

U.S. PATENT DOCUMENTS

| | | | |
|---|---|---|---|
| 8,956,952 B2* | 2/2015 | Machuca | C30B 13/34 257/615 |
| 2003/0017626 A1 | 1/2003 | Hilt et al. | |
| 2003/0043872 A1 | 3/2003 | Yokozeki et al. | |
| 2008/0164570 A1 | 7/2008 | Kouvetakis | |
| 2009/0278164 A1 | 11/2009 | Osawa et al. | |
| 2009/0308739 A1 | 12/2009 | Riker et al. | |
| 2011/0048320 A1 | 3/2011 | Choi et al. | |
| 2011/0294281 A1 | 12/2011 | Zang et al. | |
| 2013/0082239 A1 | 4/2013 | Pan et al. | |
| 2013/0333611 A1 | 12/2013 | De et al. | |
| 2013/0334568 A1 | 12/2013 | Machuca et al. | |
| 2014/0306320 A1* | 10/2014 | Arena | H01L 21/187 257/615 |

FOREIGN PATENT DOCUMENTS

| | | |
|---|---|---|
| GB | 1113211 A | 5/1968 |
| JP | 2007294579 A | 11/2007 |
| TW | 591202 | 6/2004 |
| TW | 201145447 A1 | 12/2011 |
| WO | WO 2007/094516 A1 | 8/2007 |
| WO | WO 2010/039936 A2 | 4/2010 |
| WO | WO 2013/188574 | 12/2013 |

OTHER PUBLICATIONS

Adachi, "2 Thermal Properties 2.1 Melting Point and Related Parameters 2.1.1 Phase diagram," *Properties of Semiconductor Alloys: Group IV, III-V and II-VI Semiconductors*, table 2.1 (2009).

Cverna, ASM Ready Reference: Thermal Properties of Metals (#06702G), Chapter 2: *Thermal Expansion, ASM International*, table 2.1 (2002).

PCT/US2013/045482 International Search Report and Written Opinion of the International Searching Authority, mailed Mar. 5, 2014.

PCT/US2013/045482 Invitation to Pay Additional Fees, mailed Dec. 17, 2013.

European Supplementary Search Report for application EP13803800.5 mailed Nov. 26, 2015.

PCT International Preliminary Report on Patentability for application PCT/US2013/045482 issued Dec. 16, 2014.

PCT International Preliminary Report on Patentability for application PCT/US2014/070137 issued Jun. 14, 2016.

PCT International Search Report and Written Opinion of the International Searching Authority for application PCT/US2014/070137 mailed Apr. 30, 2015.

U.S. Appl. No. 13/794,327, Notice of Allowance mailed May 15, 2014.

U.S. Appl. No. 13/794,327, Notice of Allowance mailed Jul. 18, 2014.

U.S. Appl. No. 13/794,327, Notice of Allowance mailed Oct. 16, 2014.

U.S. Appl. No. 13/794,372, Non-Final Office Action mailed Dec. 18, 2015.

U.S. Appl. No. 13/794,372, Requirement for Restriction/Election mailed Aug. 27, 2015.

* cited by examiner

SUBSTRATE STRUCTURES AND METHODS

CROSS-REFERENCE TO RELATED APPLICATION

Provisional Application Nos. 61/662,918 and 61/659,944, filed on Jun. 22, 2012 and Jun. 14, 2012, respectively and non-provisional application Ser. Nos. 13/794,372, 13/794,327, 13/794,285, all filed on Mar. 11, 2013, are incorporated herein by reference in their entireties.

TECHNICAL FIELD

The example embodiments of the present invention generally pertain to semiconductor materials, methods, and devices, and more particularly to a multilayer substrate structure for epitaxial growth of group III-V compound semiconductors and a system for manufacturing the same.

BACKGROUND

Group III-V compound semiconductor, such as gallium nitride (GaN), gallium arsenide (GaAs), indium nitride (InN), aluminum nitride (AlN) and gallium phosphide (GaP), are widely used in the manufacture of electronic devices, such as microwave frequency integrated circuits, light-emitting diodes, laser diodes, solar cells, high-power and high-frequency electronics, and opto-electronic devices. To improve throughput and reduce manufacturing cost it is desired to increase size (e.g., diameter) of substrates. Because growing III-V compound semiconductors of large size is very expensive a great number of foreign materials including metals, metal oxides, metal nitrides as well as semiconductors, such as silicon carbide (SiC), sapphire and silicon, are commonly used as substrates for epitaxial growth of III-V compound semiconductors.

However, epitaxy growth of group III-V compound semiconductors (e.g., GaN) on substrates (e.g., sapphire) poses many challenges on crystalline quality (e.g., grain boundaries, dislocations and other extended defects, and point defects) of the epitaxial layers due to lattice mismatch and coefficient of thermal expansion mismatch between the GaN layer and the underlying substrate, a foreign material. Differences in the coefficient of thermal expansion between the GaN layer and the underlying substrate result in large curvatures across the wafer, resulting during and post processing upon returning to room temperature, and the large mismatch in lattice constants leads to a high dislocation density, unwanted strain and defects propagating into the epitaxial GaN layer. In order to cope with these problems, stress relaxation strategies are employed, such as growing buffer layers between the GaN layer and the sapphire substrate, or counter balancing compressive and tensile strain by alternating appropriate material layers. However, by adding the buffer layer or stress relieving layers, the dislocation density may remain high and the manufacturing cost and complexity increases significantly because of the use of the same deposition techniques involved in growing the active device layers.

When foreign materials including metals, metal oxides, metal nitrides as well as semiconductors, such as silicon carbide (SiC), sapphire and silicon, are used as substrates for epitaxial growth of semiconductors, thin semiconductor films may be deposited on the substrate using molecular beam epitaxy (MBE) or metal organic chemical vapor deposition (MOCVD) techniques, and in some cases using atomic layer deposition (ALD) or atomic layer epitaxy (ALE). By using these methods, however, not all atoms, ions, or molecules have an opportunity to organize themselves into regular arrangements, causing many atoms to form undesirable bonding orientations and significantly decreasing the crystalline quality along with negatively impacting electronic properties of the semiconductor materials. Crystalline quality is typically described in terms of crystal size, grain size, carrier lifetime, and diffusion lengths.

While some techniques such as Zone melt recrystallization (ZMR) are designed to improve quality crystalline material they may suffer from the drawback that the temperature generated for melting a portion of the deposited film may exceed the maximum temperature that can be handled by the underlying substrate. To prevent the underlying substrate from being heated to the melting point of the deposited film, the heating time may be shortened. However, shortening the heating time means that while solidifying, the crystal structure may grow in vertical direction rather than in both vertical and lateral directions simultaneously. Hence, epitaxial growth may be dominated in the vertical direction rather than the lateral direction resulting in patches of small grains along the substrate.

BRIEF SUMMARY

According to one exemplary embodiment of the present invention, a process for separating a substrate from an epitaxial layer is described. The process comprises forming a multilayer substrate comprising a substrate, a lattice matching layer and an epitaxial layer. The method further comprises etching the lattice matching layer by one of a liquid or a vapor phase acid. The lattice matching layer is a metal alloy between the substrate and the epitaxial layer and serves as an etching release layer. The substrate can also be separated from an epitaxial layer by laser lift off process. The process comprises forming a multilayer substrate comprising a substrate, a lattice matching layer and an epitaxial layer, directing laser light at the lattice matching layer, maintaining the laser light on the lattice matching layer for a sufficient period of time so that it is absorbed by free electrons in the lattice matching layer to allow decomposition of the lattice matching layer.

According to one exemplary embodiment of the present invention, a method for manufacturing a zero bow wafer that minimizes wafer bow is described. The method comprises forming a first metal layer on one side of a substrate, the first metal layer comprising a first chemical element and a second chemical element and forming a second metal layer on the other side of the substrate, the second metal layer comprising the first chemical element and the second chemical element, wherein one of the first chemical element and the second chemical element belongs to group four elements in the periodic table.

According to one exemplary embodiment of the present invention, a method for facilitating a high temperature process on a substrate without melting the substrate is described. The method comprises forming a temperature enhancement layer on the substrate, wherein the substrate has a transition temperature lower than that of material of an epitaxial layer epitaxially grown for electronic devices.

BRIEF DESCRIPTION OF THE DRAWING(S)

Having thus described the example embodiments of the present invention in general terms, reference will now be made to the accompanying drawings, which are not necessarily drawn to scale, and wherein:

DETAILED DESCRIPTION

The various embodiments are described more fully with reference to the accompanying drawings. These example embodiments are provided so that this disclosure will be thorough and complete, and will fully convey the scope of the invention to readers of this specification having knowledge in the technical field. Like numbers refer to like elements throughout.

Figure 1A:
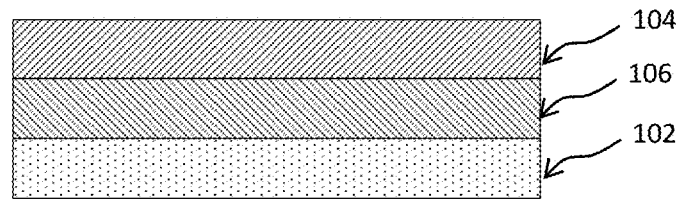
FIGS. 1A-1F illustrate example cross-sectional views of exemplary multilayer substrate structures in accordance with exemplary embodiments.

FIG. 1A illustrates an example cross-sectional view of an exemplary multilayer substrate structure 100A in accordance with an exemplary embodiment. The multilayer substrate structure 100A may include a substrate 102 and an epitaxial layer 104 epitaxially grown on the substrate 100A. Depending on various applications, the substrate 102 may comprise a semiconductor material, a compound semiconductor material, or other type of material such as a metal or a non-metal. For example, the material may comprise molybdenum, molybdenum-copper, mullite, sapphire, glass, graphite, aluminum-oxynitrides, silicon, silicon carbide, zinc oxides and rare earth oxides, and/or other suitable material.

Figure 2A:
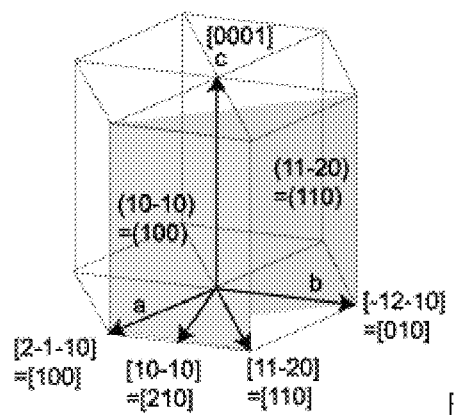
FIG. 2A illustrates a schematic of a hexagonal close-packed structure.
Figure 2B:
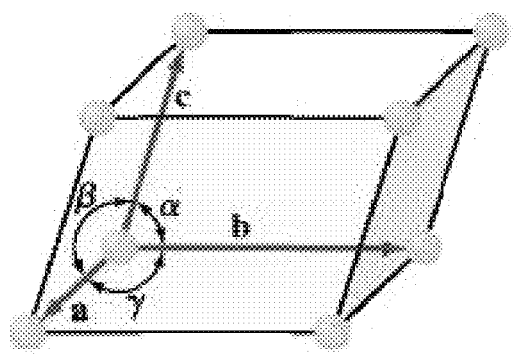
FIG. 2B illustrates a schematic of a unit cell showing lattice constants.
Figure 3:
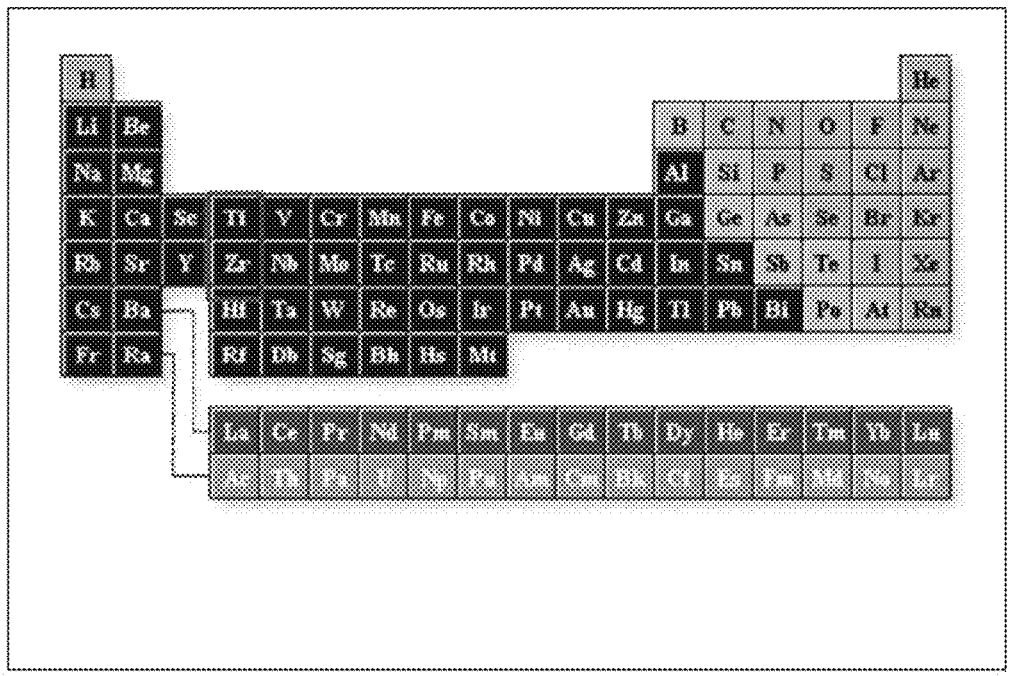
FIG. 3 illustrates a periodic table.

The epitaxial layer 104 may include group III-V compound semiconductors, such as aluminum nitride (AlN), gallium nitride (GaN), indium gallium nitride (InGaN) and indium nitride (InN). As described above, there may be a lattice constant mismatch between the substrate 102 and the epitaxial layer 104. To decrease or eliminate the defects resulting from the lattice constant mismatch, the epitaxial layer 104 growth on the substrate 102 may use a lattice matching layer 106 with thickness in a range of 5 nm-100 nm to accommodate the lattice constant mismatch between the substrate 102 and the epitaxial layer 104. The lattice matching layer 106 may comprise two or more constituent elements, for example of two constituents, a first chemical element and a second chemical element, to form an alloy. The first chemical element is miscible with the second chemical element in this alloy. The constituent elements may have similar crystal structures at room temperature, such as hexagonal close-packed structure, as shown in FIG. 2A. Each of the constituent elements may have its respective lattice constants including lattice parameters along a-axis, b-axis and c-axis, and lattice parameters of interaxial angles α, β and γ, as shown in FIG. 2B. In addition to the crystal structures, the constituent elements may have similar chemical properties. In one embodiment, the first chemical element and the second chemical element may both belong to group four elements (namely, titanium (Ti), zirconium (Zr), hafnium (Hf) and rutherfordium (Rf)) in periodic table illustrated in FIG. 3. In this way, the alloy may be made from elements Ti and Zr, elements Ti and Hf, and elements Zr and Hf and may have similar crystal structure to the constituent elements at room temperature, or by any combination of 2. The alloy may comprise a third chemical element or more elements which have similar crystal structures and similar chemical properties.

A linear relation may exist between the first and second chemical elements and their associated lattice parameters at constant temperature to allow the lattice constant of the lattice matching layer 106 to be approximately equal to that of the epitaxial layer 104. The mole fraction in atomic percentage of the first chemical element to the second chemical element is $P_1$ to $(1-P_1)$. The mole fraction may vary from application to application, as the composition will control the resulting lattice parameter value of the alloy. In one embodiment, when the epitaxial layer 104 includes GaN and the alloy of the lattice matching layer 106 includes Ti mixed with Zr, atomic percentage $P_{Zr}$ of Zr may be greater than 75% and less than 90%. For example, $P_{Zr}$ may be about 86%. It follows that atomic percentage $P_{Ti}$ of Ti is $(1-P_{Zr})$. A first lattice parameter of Zr, e.g., a-axis lattice parameter $a_{Zr}$ is 3.23 Å. A second lattice parameter of Ti, e.g., a-axis lattice parameter $a_{Ti}$ is 2.951 Å. As a result, lattice constant $P_A$ along a-axis of the alloy is $P_{Zr} \times a_{Zr} + (1-P_{Zr}) \times a_{Ti} = 86\% \times 3.23 + 14\% \times 2.951 = 3.19$ Å which is approximately equal to the a-axis lattice constant $P_{GaN}$ of hexagonal close-packed GaN where $P_{GaN}=3.189$ Å. Depending on the constituent elements and other factors, the atomic percentage of the first chemical element to the second chemical element may be about 43% to 57% or 99% to 1%.

When the epitaxial layer 104 includes different compound semiconductors (e.g., AlN, InGaN, InN and/or other group III-V compound semiconductors), the constituent elements of the lattice matching layer 106 and/or the mole fractions of the constituent elements may be adjusted to make the lattice constant of the lattice matching layer 106 accommodate that of the epitaxial layer 104. For example, when the epitaxial layer 104 comprises AlN and the constituent elements of the lattice matching layer 106 are Zr and Ti, the atomic percentage of Zr may be adjusted to be lower than 75% and higher than 50%. In another embodiment using the same constituent elements, when the epitaxial layer 104 comprises InGaN, the atomic percentage of Zr may be greater than 90%. In addition to the material of the epitaxial layer 104, the thickness of the epitaxial layer 104 may cause the changes of the selection of the constituent elements as well as mole fraction of the constituent elements to achieve 100% lattice match. Despite the changes of the thickness of the epitaxial layer 104, it may be in a range of 5 nm-500 nm. In other words, the thickness and the material of the epitaxial layer 104 may determine the selection of the constituent elements and their mole fraction in forming the lattice matching layer 106. By using any epitaxial techniques, such as vacuum evaporation, sputtering, molecular beam epitaxy and pulsed laser deposition, metalorganic chemical vapor deposition, atomic layer deposition and/or any other suitable epitaxial deposition methods, the epitaxial layer 104 is epitaxially grown on the lattice matching layer 106 to transfer the crystallographic pattern of the lattice matching layer 106 to the epitaxial layer 104. The lattice matching layer 106 may be formed on the underlying layer, for example, the substrate 102 using one of deposition techniques, such as vacuum evaporation, sputtering, molecular beam epitaxy and pulsed laser deposition, atmospheric chemical vapor deposition, and atomic layer deposition.

Figure 4:
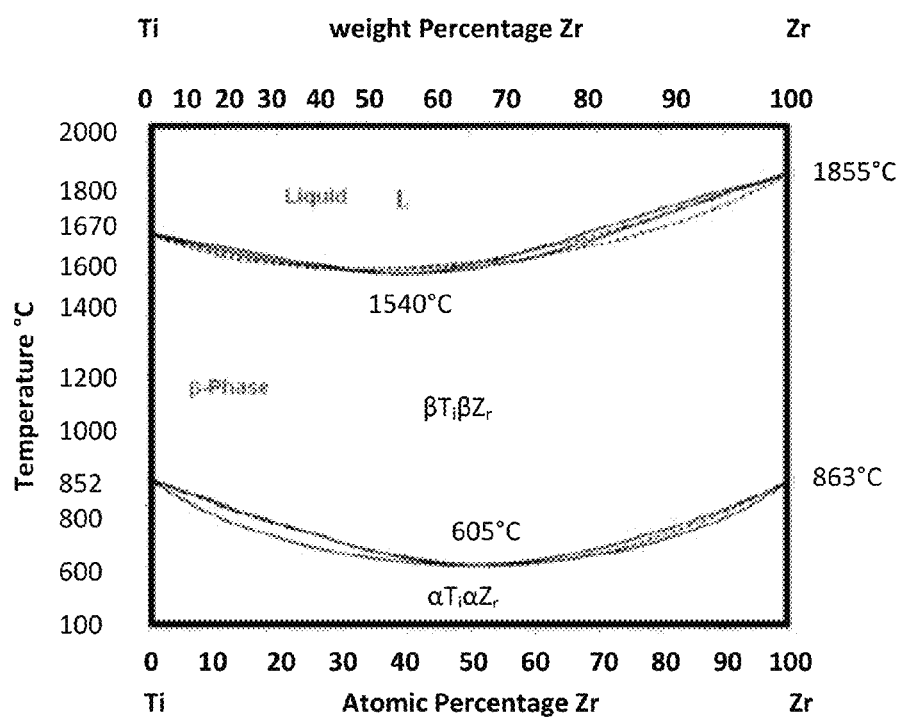
FIG. 4 illustrates a phase diagram correlation between transition temperature and atomic percentage of constituent elements in accordance with an exemplary embodiment.

Because hexagonal close packed phase (α phase) has potential superiority over the body centered cubic phase (phase) for certain opto-electronic devices and power semiconductor applications, it may be desired to grow the epitaxial layer 104 in α phase to achieve similar crystallographic pattern of the lattice matching layer 106. FIG. 4 shows a correlation between the α-β phase transition temperature and the atomic percentage of Zr and Ti in accordance with an exemplary embodiment. For example, when $P_{Zr}$ is 50%, $P_{Ti}=1-P_{Zr}=50\%$, the α-β phase transition temperature is about 605° C. When $P_{Zr}$ is 84%, an example that has been illustrated above, the α-β phase transition temperature may be about 780° C. In an application of fabricating multi-quantum-well (MQW) devices on the epitaxial layer 104 (e.g. ultra high brightness LEDs), the epitaxial deposition method, such as metal organic chemical vapor deposition and atomic layer deposition and/or any other suitable methods for epitaxial growth, may be performed in a temperature range of 700° C.-850° C. In this embodiment, the multilayer substrate structure may be heated by any heating methods/heat sources under the α-β phase transition temperature 780° C. but greater than 700° C. in an attempt to transfer the crystallographic pattern of the lattice matching layer 106 to the epitaxial layer 104 in a phase, avoiding β phase transition. Then the temperature for heating the multilayer substrate structure during subsequent MQW growth, along with any additional device layers, can be raised above or lowered below 780° C. since epitaxial layer 104 has been formed and is permanently set in the α phase. The temperature may be initially raised above the α-β phase transition and then immediately dropped below α-β phase transition temperature to invoke generating phase transition free energy to crystallize large lateral areas resulting in single crystal α-phase in the lattice matching layer.

By introducing the lattice matching layer 106, the stresses may be lowered that might otherwise occur in the epitaxial layer 104 developed during the epitaxy growth as a result of difference in lattice constants between the substrate 102 and the epitaxial layer 104, and by doing so, aids in the growth of a high crystalline quality epitaxial layer 104. If such stress is not relieved by the lattice matching layer, the stress may cause defects in the crystalline structure of the epitaxial layer 104. Defects in the crystalline structure of the epitaxial layer 104, in turn, would make it difficult to achieve a high quality crystalline structure in epitaxy for any subsequent device growth. The lattice matching layer 106 is also disclosed in U.S. patent application entitled "A Lattice Matching Layer for Use In A Multilayer Substrate Structure."

Figure 1B:
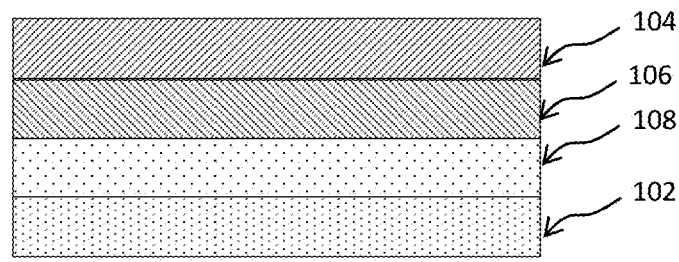

As described above, the substrate 102 may comprise a semiconductor material, a compound semiconductor material, or another type of material such as a metal or a non-metal. In some embodiments, the substrate 102 may be in the form of a polycrystalline solid. Polycrystalline substrates may negatively impact the lattice matching layer 106 by making it polycrystalline instead of single crystal, thus enlarging the difference of lattice constants between the lattice matching layer 106 and the epitaxial layer 104 (an average lattice constant over multiple grains and multiple crystalline orientations), and causing extended defects such as threading dislocations or grain boundaries, leading to poor crystalline quality of the epitaxial layer 104. To reduce or eliminate the negative impact of a polycrystalline substrate, an amorphous layer 108 may be introduced between the polycrystalline substrate 102 and the lattice matching layer 106, as shown in multilayer substrate structure 100B of FIG. 1B. By adding the amorphous layer 108 between the polycrystalline substrate 102 and the lattice matching layer 106, the impact of the polycrystalline substrate 102 on the lattice matching layer 106 may be reduced. In this way, only crystallography of the lattice matching layer 106 is transferred to the epitaxial layer 104. The amorphous layer 108 may comprise, but not limited to, one of silicon dioxide, silicon nitride, tantalum nitride, boronitride, tungsten nitride, glassy amorphous carbon, silicate glass (e.g., borophosphosilicate glass and phosphosilicate glass) and/or other suitable materials. The amorphous layer 108 may have a thickness of 5 nm to 100 nm.

Figure 1C:
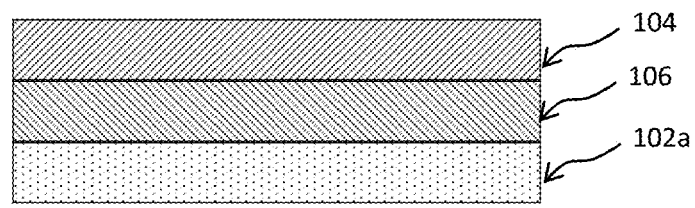
Figure 1D:
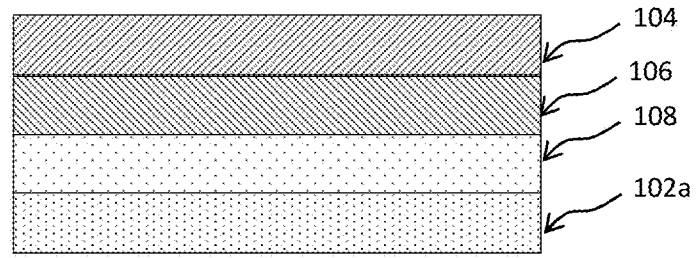

In some embodiments, the coefficient of thermal expansion of the substrate 102 may be different than that of the above layers, resulting in large substrate curvatures. For example, when the coefficient of thermal expansion of the substrate 102 is greater than that of the above layers, biaxial compressive strain arises (e.g. when the substrate comprises sapphire). When the coefficient of thermal expansion of the substrate is less than that of the above layers, tensile strain arises (e.g. when the substrate comprises silicon). To overcome the drawback caused by the mismatch in the coefficient of thermal expansion, the substrate may be used as a thermal matching layer 102a (shown in FIGS. 1C and 1D) by including some chemical elements to accommodate the thermal mismatch between the substrate (namely, the thermal matching layer 102a in this embodiment) and the lattice matching layer 106 as shown in multilayer substrate structure 100C of FIG. 1C, or between the substrate and the amorphous layer 108 as shown in multilayer substrate structure 100D of FIG. 1D. In one embodiment, the thermal matching layer 102a may comprise molybdenum or its related alloys. The coefficient of thermal expansion of molybdenum is about $5.4\times10^{-6}$/K which is approximately equal to that of some group III-V compound semiconductors, such as GaN. The substrate may be fabricated using a variety of methods for growth of metals, crystals, and their alloys. Example may include Czochralski, float zone (FZ), directional solidification (DS), zone melt recrystallization (ZMR), sintering, isostatic pressing, electro-chemical plating, plasma torch deposition, and/or other suitable methods. The thermal matching layer 102a has a thickness in a range of 5 nanometer to 1 millimeter.

By introducing the thermal matching layer and the lattice matching layer, the strain caused by the thermal expansion mismatch and lattice mismatch may be reduced or completely eliminated. As a result, the dislocation density may be less than $10^2/cm^2$ (<100 dislocations per square centimeter) in the resulting epitaxial layer 104. In development of light emitting diodes (LEDs), the reduction or elimination of the strain may fulfill requirements to overcome the so-called "green gap." The "green gap" is an industry expression for a droop or decrease in LED light output from MQW LEDs that alloy indium with GaN to fabricate green LED's. This droop in green light outputted occurs for forward currents >50 mA in 1 to 5 square millimeter device areas due to defect density resulting from excessive strain from substrates, stress induced extended defects and point defects propagating into active MQW device layers.

Because the human eye is most sensitive to green and green light strongly affects the human perception to the quality of white light, the present embodiment enables high crystalline quality devices grown on layer 104. Moreover, exemplary embodiments of the present invention qualify a cost effective manner of manufacturing a green LED crystalline template. As such, the fulfilling of the "green gap" may enhance the high performance of white light emitting diodes based on mixing light from red, green and blue, having the highest theoretical efficacies over phosphor based down conversion LEDs used today.

As described above, the substrate 102 may comprise a semiconductor material, a compound semiconductor material, or other type of material such as a metal or a non-metal such as molybdenum, molybdenum-copper, mullite, sapphire, glass, graphite, aluminum-oxynitrides, silicon, silicon dioxide, silicon nitride, silicon carbide, zinc oxides and rare earth oxides, and/or other suitable material. Depending on various applications, such as applications of ultra large light emitting diode displays with true RGB capability (no lossy phosphors) or very large current capability (unlike OLEDs and other display technologies) such as large bill boards for example, optional and additional layers may be formed on the substrate 102 to facilitate a high temperature process.

Figure 1E:
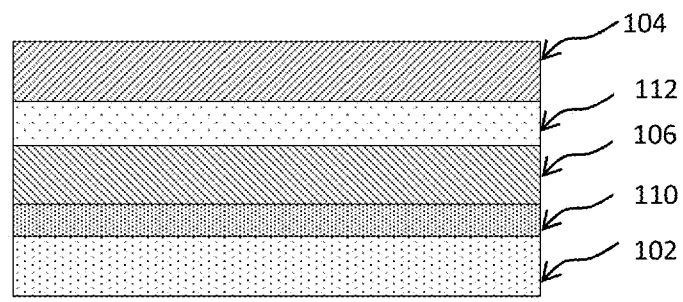

In one embodiment, using high temperature GaN, when the substrate 102 comprises material, for example a low temperature glass, that has a transition temperature lower than the GaN, a temperature enhancement layer 110, as shown in multilayer substrate structure 100E of FIG. 1E, may be introduced between the low temperature substrate 102 and the lattice matching layer 106. For example, if the substrate is glass having a transition temperature, about 400° C.-700° C., the introduction of the temperature enhancement layer 110 may facilitate the creation of the multi-layer substrate in a high temperature such as between 500° C.-1050° C. without melting the underlying substrate. The temperature enhancement layer 110 may have a thickness of 10-500 nm. The temperature enhancement layer 110 may comprise Alumina, Sapphire, Tungsten, Tungsten-Nitride, Glassy Carbon, diamond, diamond like carbon (DLC) or other suitable material that allows the glass to be taken to its transition temperature without melting the glass. The temperature enhancement layer 110 is selected such that it removes the heat before the glass or low temperature substrate over softens losing shape. In one embodiment, the substrate is a low temperature glass and the temperature enhancement layer 110 comprising Tungsten may be about 500 nm. The lattice matching layer 106 may be about 5-500 nm chosen to match for example, when the epitaxial layer 104 comprises GaN and the alloy of the lattice matching layer 106 comprises a first chemical element mixed with a second chemical element, atomic percentage $P_1$ of the first chemical element to $(1-P_1)$ of the second chemical element may be 86% to 14% or when the epitaxial layer 104 comprises InGaN, atomic percentage $P_1$ to $(1-P_1)$ may be 99% to 1%. An optional nitridation layer 112 with a thickness of 1-50 nm may be introduced between the lattice matching layer 106 and the epitaxial layer 104. The temperature enhancement layer 110 and the nitride layer 112 may be deposited on the substrate using magnetron reactive physical vapor deposition (MR-PVD), molecular beam epitaxy (MBE), or metal organic chemical vapor deposition (MOCVD) techniques, and in some cases using atomic layer deposition (ALD) or atomic layer epitaxy (ALE).

The application of the multilayer substrate structures 100 may be used in, but not limited to, any device using GaN or GaN in the alloy of Al or In as part of the substrate such as power transistors, power diodes, high electron mobility transistor, field effect transistor and bipolar junction transistor. The application of the multilayer substrate structure 100 may be used in, but not limited to, any device using GaN or GaN in the alloy of Al or In such as UV light emitting diodes, blue, green, or white light emitting diodes or optical devices such as photocathodes for photo emitters, photodiode or charge coupled devices for photo absorbers, or laser emitters such as vertical cavity surface emitting laser or standard laser diodes, such as UV, blue and green laser diodes.

Figure 1F:
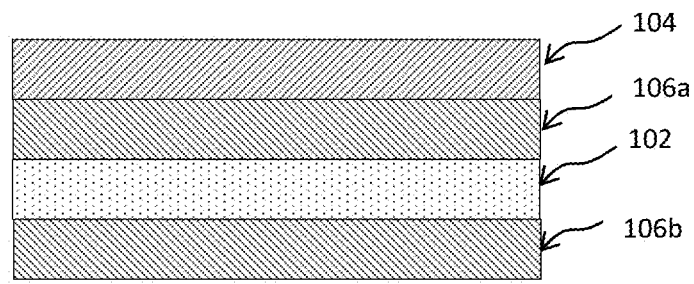

A zero bow wafer i.e., a wafer structure that minimizes or eliminates wafer bow, may be created by forming matching metal alloy layer on both sides of a wafer. For example, a zero bow multilayer substrate structure 100F is shown in FIG. 1F. When the substrate 102 comprises silicon material, or other material with similar properties, the zero bow multilayer substrate structure may be created by forming a lattice matching layer 106a on one side of the substrate 102 and a lattice matching layer 106b on the other side of the substrate 102 may be used to create equal but opposite strain forces to help maintain the wafer flat, minimizing bow. The lattice matching layer 106a and 106b may comprise Zr and Ti. For example, atomic percentage $P_1$ of the first chemical element to $(1-P_1)$ of the second chemical element may be 86% to 14% of layers 106a and 106b for epitaxial layer 104 comprised of GaN or when layer 104 is comprised of InGaN, atomic percentage $P_1$ to $(1-P_1)$ may be 99% to 1% of layers 106a and 106b. Similarly when the atomic percentage $P_{Zr}$ of Zr is between 50%-60% of 106a and 106b, and the resulting atomic percentage $P_{Ti}$ of Ti is $(1-P_{Zr})$, the zero bow multilayer substrate structure 100F may comprise alumni gallium nitride (AlGaN) for layer 104 that is grown on the lattice matching layer 106a.

The application of the zero bow multilayer substrate structure 100F may include, but not be limited to, high power transistors such as high electron mobility transistors (HEMTs). The hetero-epitaxy of GaN and AlGaN may be formed on the lattice matching layer 106 using molecular beam epitaxy (MBE) or metal organic chemical vapor deposition (MOCVD) techniques. The zero bow multilayer substrate structure 100F may allow an integration of integrated GaN electronics with Si CMOS circuits as well as inductive, capacitive and resistive circuit elements on a Si (100) substrate or Si (111) in a standard Si processing line. The integration may allow combination of the high complexity and flexibility of Si circuits with integrated GaN electronics such as integrated power IC, monolithic diodes and power transistors to yield high standoff voltage or high current switching capability or high switching speeds by, for example, making the AlGaN on GaN epitaxial layer grown on the lattice matching layer 106a or 106b and making the power conditioning components, inductors, resistors, capacitors, filters, logic and ADCs in Si (100) or Si (111) CMOS.

Figure 1G:
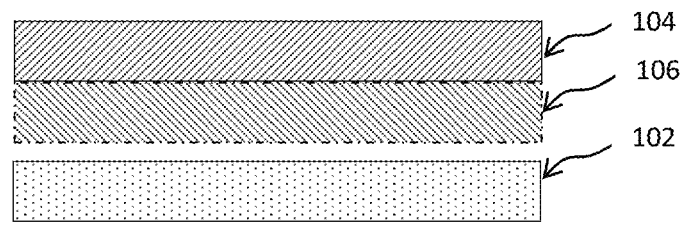
FIG. 1G illustrates example cross-sectional views of laser lift off process to remove substrate in example multilayer substrate structures in accordance with exemplary embodiments.

FIG. 1G illustrates through exemplary cross-sectional views, a laser lift off process that can be used to lift layers, such as single crystal film layers from a substrate. This is most advantageous when employing any of the disclosed multilayer substrate structures. For example, a substrate 102, such as sapphire substrate, silicon substrate and or any wideband gap semiconducting substrate, may have poor electrical and thermal conductivity. So it may be desirable to remove the substrate 102 on which epitaxial layers, such as GaN layers or GaN in the alloy of In or Al layer, have been epitaxially grown for optoelectronic devices, such as light emitting diodes or lasers. The separation of the epitaxially grown layers from the substrate may be performed by the disclosed lift off process. To remove or lift off the epitaxial layer 104 from the substrate 102, the lattice matching layer 106 may be attacked by simple liquid or vapor phase acids commonly found in semiconductor cleans, such as hydrochloric acid and trifluoroacetic acid, or dilute sulfuric acid hydrogen peroxide mixes. The lattice matching layer 106 may be designed to serve as an etch release layer.

A laser may also be used to induce a break or separation in the interface of the substrate 102 and the lattice matching layer 106. The laser light may be absorbed by free electron of the lattice matching layer 106. The free electron absorption allows the decomposition of the lattice matching layer to avoid the damage of the substrate 102. In this manner, the substrate can be reused for future use without necessarily having to re-polish the substrate, a time consuming and costly step for hard materials like SiC or sapphire.

Because laser lift off process is insensitive to wavelength, the substrate 102 may be transparent and the epitaxial layer 104 may be opaque. By introducing the lift off lattice matching layer 106, the layer that is separated from the substrate using laser lift off may have a thickness from 10-500 nm, not limited to.

Figure 5:
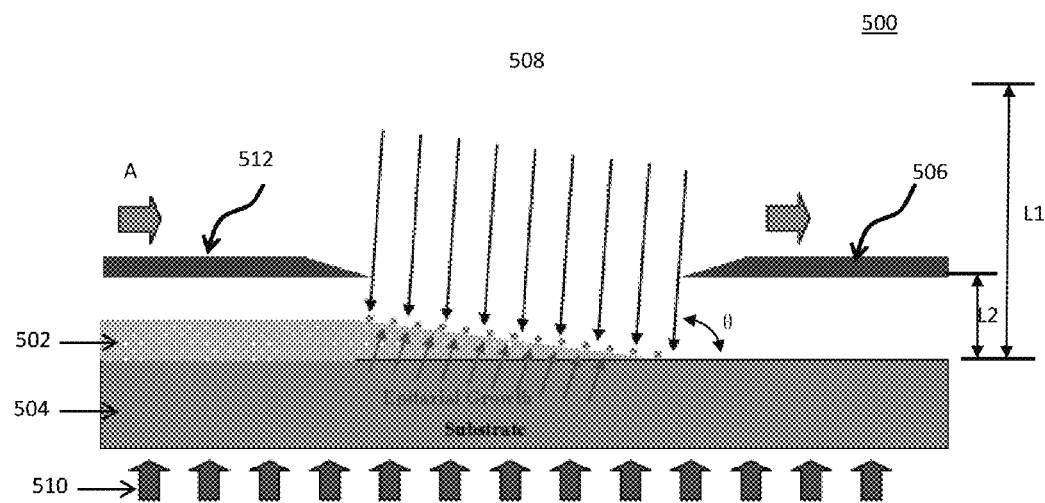
FIG. 5 illustrates an example system of depositing a film on a substrate in accordance with an exemplary embodiment.

FIG. 5 illustrates a system 500 of depositing a film on a substrate in accordance with an exemplary embodiment ("example," "exemplary" and like terms as used herein refer to "serving as an example, instance or illustration"). To facilitate epitaxial deposition of a thin film 502 on a substrate 504 in lateral direction A, a lateral control shutter 506 is employed and disposed between the substrate 504 and a material source 508. The material source 508 is configured to deposit source material onto substrate surface using a suitable deposition method. Depending on the deposition method employed, the source material may be vaporized from a solid or liquid source in the form of atoms or molecules and transported as a vapor through a vacuum or low-pressure gas or plasma environment to the substrate. The vaporized material may be an element, alloy, or compound in various charged states. When vaporized material has a long mean free path greater than 1 meter and the trajectory of the vaporized material may be considered direct line-of-sight. The deposition process employed is therefore defined as light-of-sight deposition. Line-of-sight deposition methods may be physical vapor deposition or chemical vapor deposition, including vacuum evaporation, sputtering, pulsed laser deposition, molecular beam epitaxy, atomic layer deposition, atomic layer epitaxy, plasma torch deposition and/or any other suitable methods. The chemical vapor deposition may be atmospheric chemical vapor deposition and/or any other suitable chemical vapor deposition methods. Depending on the source configurations, the vacuum evaporation includes thermal evaporation, laser beam or focused lamp evaporation, arc-discharge evaporation and electron-beam evaporation. Similarly, depending on the source configurations, the sputtering method may comprise one of direct current sputtering, magnetron sputtering, radio frequency sputtering, and pulsed laser sputtering.

In any application of the above deposition methods, distance L1 between the material source 508 and the substrate 504 may be less than the mean free path of the gas molecules thus allowing most of the molecules in a gas to arrive in a collimated manner. To uniformly form the thin film 502 over the substrate 504 surface, distance L2 between the lateral control shutter 506 and the substrate surface may be less than the mean free path of the gas molecules. In this case, the mean free path is defined as the average distance a gas molecule travels before colliding with another gas molecule. The substrate 504 may comprise of silicon dioxide, silicon nitride, amorphous boronitride, amorphous tungsten nitride, glassy amorphous carbon, amorphous rare earth oxides, amorphous zinc-oxide, and silicate glass.

Figure 6A:
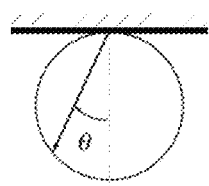
FIGS. 6A-6C illustrate exemplary angular distributions of vaporized material in a sputtering deposition process.
Figure 6B:
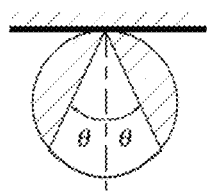
Figure 6C:
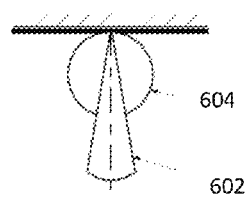

Different deposition processes may have different flux angular distributions at the substrate. There are many ways in each deposition process to aid improvement of the angular distribution at the substrate. Taking sputtering deposition process as an example, in a general sputtering deposition process, it is not unusual that a large fraction of the atoms impinging on the substrate may not impinge the substrate at a normal incidence angle because the atoms are emitted from the material source (i.e., sputtering target) in a cosine angular distribution, as shown in FIG. 6A. To produce more normal angular distribution at the substrate, a collimator may be employed and placed between the substrate and the sputtering target in a magnetron sputtering system. The employment of the collimator tends to reduce the non-normal flux from the sputtering target resulting in an increase of the directionality of the deposit. The angular distribution of collimated incidence are shown in FIG. 6B. In an ion-assisted deposition process, a fraction of the sputtered atoms are ionized. The ionized atoms may be concentrated near $\theta=0°$ to form a directional angular distribution, e.g., directional angular distribution 602, while the neutral species typically have a cosine angular distribution 604. The overall angular distribution is viewed as a superposition of a cosine and directional angular distribution as shown in FIG. 6C.

In vapor deposition processes, the angle of incidence of evaporated material onto the substrate may affect the film properties, crystal orientation and other characteristics. Depending on the angular distribution of the incident atom flux generated by the material source and the desired angular distribution of the atoms at the substrate, the vaporized material may be deposited onto the substrate surface at normal angle-of-incidence or off-normal angle-of-incidence. Referring back to FIG. 5, the source material may be deposited at angles of incidence of $-15°$ to $+15°$. The mean angle-of-incidence of the depositing atom flux may vary depending on deposition geometry, type of vaporization source and relative movement between the substrate and the material source.

As illustrated in FIG. 5, the lateral control shutter 506 is employed to control film growth. The lateral control shutter 506 may define a lateral boundary (not numbered) of the depositing thin film 502 and cover some predetermined portion of the substrate 504 to prevent deposition of source material onto portions of the substrate surface. In operation, by moving one or the other of the lateral control shutter 506 or the substrate 504, the lateral boundary of the depositing thin film 502 is moved and controlled to advance the growing edge of the film to facilitate the lateral epitaxial deposition across the substrate. In one example illustrated in FIG. 5, the lateral control shutter 506 is moved with respect to the substrate 504 in direction A. In another example, the lateral control shutter may remain static while the substrate moves with respect to the lateral control shutter. Still in another example, both the lateral control shutter and the substrate may move at a different speed to achieve relative movement there between. The system 500 may also include a drive system (not shown) to control the relative movement between the lateral control shutter and substrate. The system 500 may include a trailing control shutter 512 which is used to help mask any unwanted deposition onto the single crystal being left behind the advancing growing edge of the thin film 502. The latter assists in maintaining uniform film thickness across the thin film 502. If a trailing control shutter is employed, the trailing control shutter 512 can be configured to avoid further epitaxial deposition onto the newly crystallized thin film 502 over the substrate 504.

Since many film properties, such as grain size of the deposited material on the substrate, are influenced by the deposition temperature, temperature control is desirable. Depending on the deposition methods employed, the system 500 may include different types of heat sources (e.g., heat source 510 in FIG. 5) to control the temperature of the substrate and/or provide elevated temperatures that may be used in the deposition process. For example, in a vacuum deposition process, heat sources are typically used to thermally evaporate source material, desorb deposited material from target source surfaces, heat substrates for cleaning and subsequent processing, melt source material, and add thermal kinetic energy or to enhance surface mobility of adatoms or molecules participating in the deposition process on the substrate surface. Heat may be generated in the vacuum chamber by a number of different techniques. In the example of a sputtering deposition process, the substrate may be heated by ion bombardment, electrons, optical radiation, inductive heating, or other heating techniques. The heat source may be embedded in or external to the system. Exemplary heat sources may include a radiant heater (infrared heating, lasers, and the like), hot wire radiative heating, focused lamp heating, inductive heating, direct metal pedestal heater, or ceramic pedestal heater.

Figure 7A:
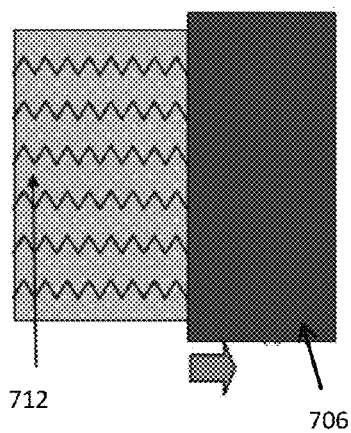
FIGS. 7A-7D illustrate example methods of growing large extended crystals on the substrate in accordance with exemplary embodiments of the present invention.

When film of a single crystal material is deposited on a substrate, epitaxial growth occurs allowing the crystallographic structure of the substrate to be reproduced in the growing material when a single seed is isolated on the substrate surface or when the substrate is single crystal. As lateral growth of crystals plays an important role in determining the material properties, such as dislocation density and strain that result from a lattice mismatch between the deposited material and the substrate, a lateral control shutter can be employed to facilitate the epitaxial growth of the deposited material in a lateral direction. Due to relative movement between a lateral control shutter and the substrate, the epitaxial growth initially occurs in the direction substantially normal to the surface of the substrate, e.g., in a vertical direction, and then proceeds in a direction substantially parallel to the surface of the substrate, e.g., in a parallel direction. A lateral crystalline epitaxial growth is illustrated in FIG. 7A. In FIG. 7A, the lateral control shutter 706 moves from the left end 712 of the substrate toward the other end of the substrate (not shown), allowing the epitaxial growth to start from the left end 712. A plurality of grains at many points on the left end 712 may grow and serve as seed crystals for subsequent crystal growth. Crystals initially grow in a vertical direction. With the movement between the lateral control shutter 706 and the substrate, crystals may grow in the lateral direction and the vertical direction simultaneously.

Grain size of the deposited film plays an important role in its electrical properties. As the grain size increases, the number of grain boundaries per unit area and the number of boundary interfaces decrease. For example, a high density of grain boundaries, e.g., a small grain size, or extended defects in the crystal structure, tends to decrease the electrical and thermal conductivity of the deposited film. Hence it is desirable to increase grain size where possible. Exemplary embodiments of achieving minimum grain boundaries and minimum number of grains on the substrate are illustrated in FIGS. 7B-7D.

Figure 7B:
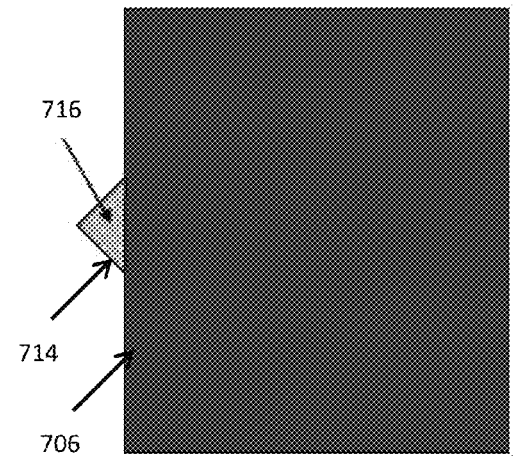

As shown in FIG. 7B, the lateral control shutter 706 is placed between the substrate (not shown) and the material source (not shown) and covers a portion of the substrate, leaving a region (e.g., region 714) exposed to the material source. The region 414 may have a sharp corner or an edge. In this embodiment, the sharp corner is a corner of the substrate made by adjusting the placement of the lateral control shutter and the substrate. By such an arrangement, a self-selected seed grain 716 may grow at the sharp corner. The seed grain serves as a seed crystal to initiate crystallization and to provide a point for the deposition to begin. With relative movement between the lateral control shutter 706 and the substrate in the lateral direction, a crystal grows simultaneously in both the vertical and lateral directions across the entire surface of the substrate. In another example, there may be more than one seed grain grown at the sharp corner and the lateral advancement aids in driving the grain boundaries in outward directions, effectively forming a minimum plurality of grains with very large lateral dimensions across the entire substrate.

Figure 7C:
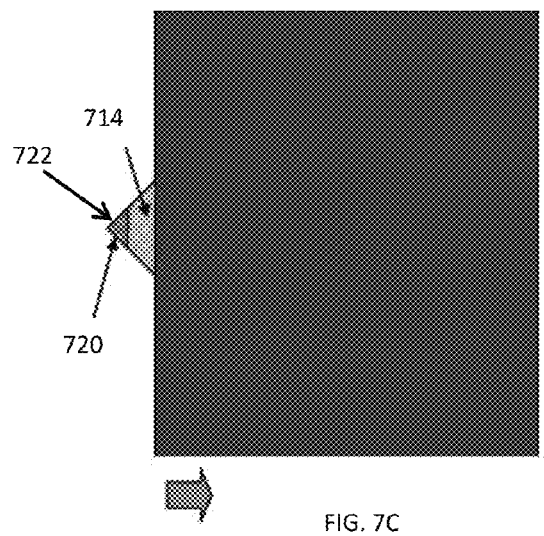
Figure 7D:
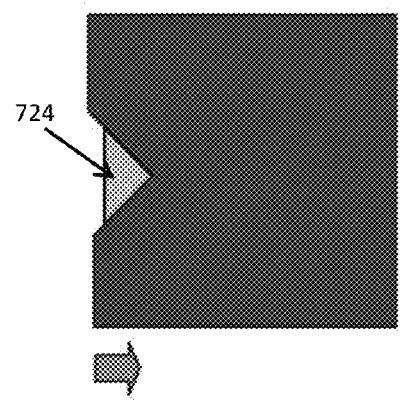

In an embodiment illustrated in FIG. 7C, graphoepitaxy may be employed for creating long-range order during thin film deposition on the substrate surface or during recrystallization of molten material on the substrate surface by patterning a portion of the substrate surface to form a surface relief structure, e.g., surface relief structure 720. The surface relief structure 720 may serve as a template for growing a seed grain on the substrate and induce a desired crystallographic orientation in the newly growing thin film. The seed grain is then employed to initiate crystallization and to provide a point of origin for the depositing film to begin. Similar to the embodiment illustrated in FIG. 7B, with relative movement between the lateral shutter 506 and the substrate in the lateral direction, the single grain simultaneously grows in both vertical and lateral directions across the entire surface of the substrate. The surface relief structure 720 may be made by a variety of lithography techniques, such as optical lithography, electron beam lithography, nanoimprint lithography, or focused-ion-beam (FIB) lithography and/or any other suitable lithography techniques. Alternatively, the surface relief structure 720 might be transferred or added to the corner or edge of the substrate by laser heating process or ablation. In this embodiment, the seed grain may extrude out on the substrate plane as the growing edge advances away from the corner.

In addition to introduction of the surface relief structure 720, a seed crystal 722 may be added to a point of the substrate, for example, a corner of the substrate. The seed crystal may be employed to initiate crystallization and to provide a point of origin for the depositing film to begin. Similarly, the added seed crystal may extrude out on the substrate plane as the growing edge advances away from the corner.

Similar to FIG. 7B, FIG. 7D illustrates a seed grain growing outward laterally beginning at a sharp corner of a region 724 of the substrate with the region exposed to the material source. In contrast to FIG. 7B, the sharp corner in this embodiment is not made by adjusting the placement of the substrate and the lateral control shutter. Instead the sharp corner is shaped by a shutter having such a shape. A seed grain may grow at the sharp corner and serve as a seed crystal to initiate crystallization and to provide a point of origin for the deposition to begin. The added advantage of utilizing a triangle as shown, or a crescent with same curvature, is that through grain competition the grain boundaries will grow perpendicular to the shape of the shutter edge. The latter will necessarily grow any grains parallel to the plane of the substrate wider as the growing edge advances away from the seed crystal.

In the embodiments described above, the shutter may have various shapes according to different applications. For example, as illustrated in FIG. 7D, the shutter may be in the shape of a polygon or an arc. A portion of the periphery of the polygon defines a shape with a sharp corner at which the seed grain grows. The shutter may be in the shape of rectangle, square, circle, triangle, crescent shape, or a "Chevron symbol" shape, and/or any other suitable shapes. The shutter can be used for any epitaxial thin film growth allowing crystals grow in lateral and vertical directions simultaneously on a substrate. For example, the shutter can be used for growing a lattice matching layer in a multilayer substrate structure.

Many modifications and other example embodiments set forth herein will bring to mind to the reader knowledgeable in the technical field to which these example embodiments pertain to having the benefit of the teachings presented in the foregoing descriptions and the associated drawings. Therefore, it is to be understood that the embodiments are not to be limited to the specific ones disclosed and that modifications and other embodiments are intended to be included within the scope of the claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions other than those explicitly described above are also contemplated as may be set forth in some of the appended claims.

What is claimed is:

1. A process for separating a substrate from an epitaxial layer, comprising:
    forming a multilayer substrate comprising a substrate, a lattice matching layer and an epitaxial layer, wherein the lattice matching layer is a metal alloy;
    etching the lattice matching layer by one of a liquid or a vapor phase acid, wherein the metal layer is between the substrate and the epitaxial layer and serves as an etching release layer.

2. The process of claim 1, wherein the substrate comprises one of sapphire, silicon or AlN material.

3. The process of claim 1, wherein the epitaxial layer comprises one of GaN or GaAs material.

4. The process of claim 1, wherein the acid comprises hydrochloric acid and trifluoroacetic acid.

5. The process of claim 1, wherein lattice matching layer comprises a first chemical element and a second chemical element, and wherein at least one of the first chemical element and the second chemical element belongs to group four elements in the periodic table.

6. The process of claim 5, wherein the first chemical element comprises Zr and the second chemical element comprises Ti.

7. A laser lift off process to separate a substrate from an epitaxial layer, comprising:
    forming a multilayer substrate comprising a substrate, a lattice matching layer and an epitaxial layer, wherein the lattice matching layer is a metal alloy;
    directing laser light at the lattice matching layer, wherein the lattice matching layer is between the substrate and the epitaxial layer,
    maintaining the laser light on the lattice matching layer for a sufficient period of time so that it is absorbed by free electrons in the lattice matching layer to allow decomposition of the lattice matching layer.

* * * * *